United States Patent [19]
Bury

[11] Patent Number: 5,735,213
[45] Date of Patent: Apr. 7, 1998

[54] PRINTING PRESS PROGRAMMABLE LOGIC CONTROLLER CONVERSION METHOD

[76] Inventor: Bryan L. Bury, 210 SW. Seagull Ct., Lee's Summit, Mo. 64082

[21] Appl. No.: 705,700

[22] Filed: Aug. 30, 1996

[51] Int. Cl.[6] ............................................. B41F 1/56
[52] U.S. Cl. ............................................. 101/480; 361/686
[58] Field of Search ................................. 101/479, 480, 101/183, 184, 185; 400/692; 361/686, 731, 733

[56] References Cited

U.S. PATENT DOCUMENTS

| | | | |
|---|---|---|---|
| 3,925,710 | 12/1975 | Ebert | 361/686 |
| 4,744,006 | 5/1988 | Duffield | 361/686 |
| 4,784,060 | 11/1988 | Weisgerber et al. | 101/426 |
| 4,918,335 | 4/1990 | Chall, Jr. | 361/733 |
| 5,099,391 | 3/1992 | Maggelet et al. | 361/395 |
| 5,320,040 | 6/1994 | Simeth | 101/232 |
| 5,353,198 | 10/1994 | Kabat et al. | 361/731 |
| 5,541,810 | 7/1996 | Donhauser et al. | 361/731 |

OTHER PUBLICATIONS

Keyence Corporation, KV Series Super Micro PLC User's Manual for Models KV-300 and KV-10 to KV-80 Programming Manual for KV Ladder Software, published in 1995.

*Primary Examiner*—John S. Hilten
*Assistant Examiner*—Steven S. Kelley
*Attorney, Agent, or Firm*—Litman, McMahon & Brown, LLC

[57] ABSTRACT

A printing press programmable logic conversion apparatus and method involves the replacement of a series of OEM relay logic printed circuit boards with a single programmable logic controller or PLC. The PLC is connected into a rack which includes a plurality of male edge connectors attached together and spaced apart to replace the OEM PC boards. The PLC is preprogrammed to emulate the replaced OEM PC boards such that, by removing the OEM PC boards and simply plugging in the PLC rack in their place, an older press can be converted to PLC control within a matter of minutes.

3 Claims, 2 Drawing Sheets

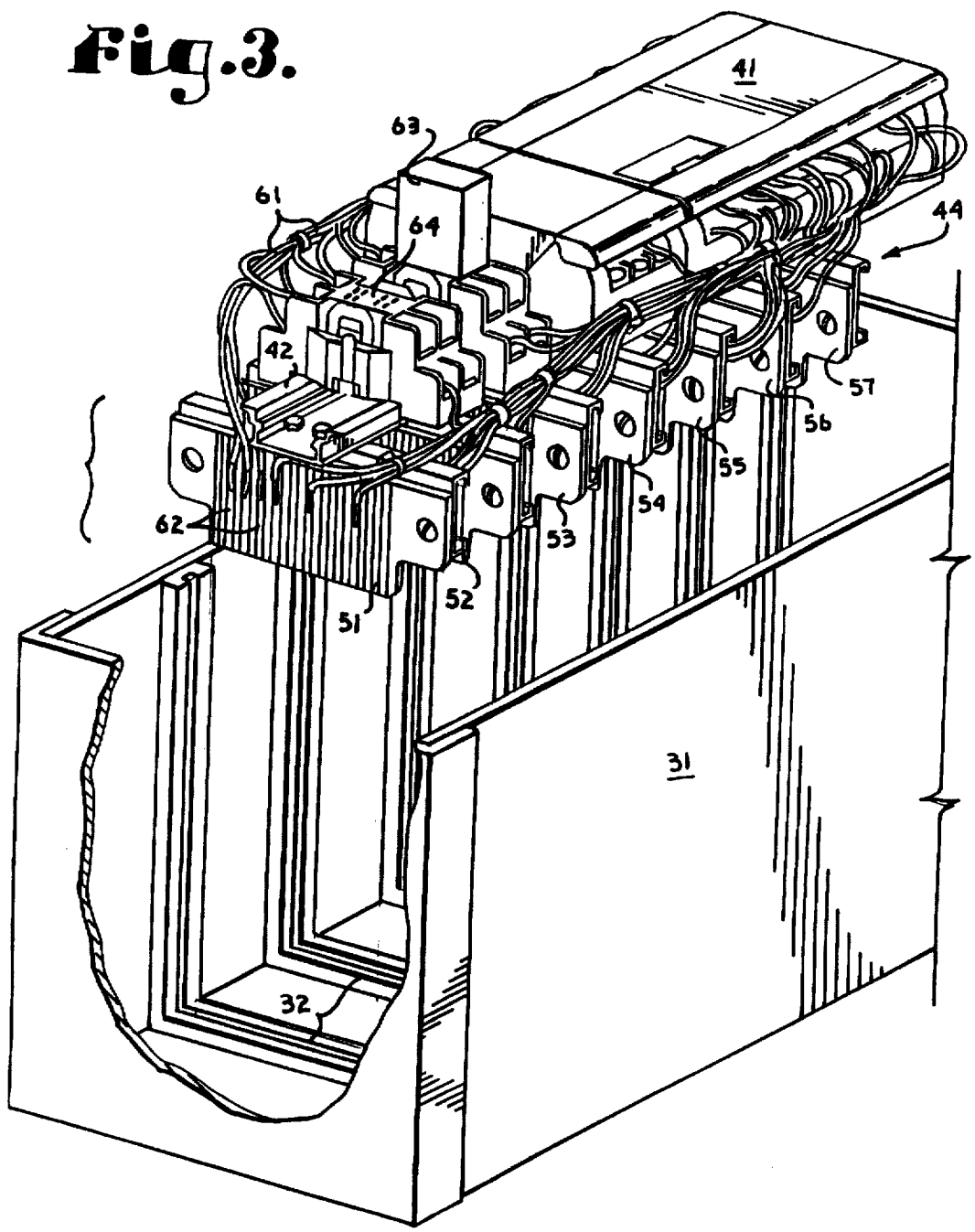

PRINTING PRESS PROGRAMMABLE LOGIC CONTROLLER CONVERSION METHOD

BACKGROUND OF THE INVENTION

1. Field of the Invention

The present invention relates generally to a method and apparatus for installing a programmable logic controller on an existing printing press as a replacement for a plurality of discrete PC boards. More particularly, the programmable logic controller is positioned in a custom rack and hard wired to a plurality of edge connectors in the rack. The PC boards are then removed from the printing press and the programmable logic controller is simply plugged in to replace the removed PC boards.

2. Description of the Related Art

Modern multiple color sheet-fed printing presses have evolved in size and complexity to the point that they are fully automated and digitally controlled. Such modern presses are faster and more efficient than older models, but a modern four or five color sheet-fed press can cost upwards from one to more than five million dollars.

Meanwhile, functional older sheet-fed presses are available for a fraction of the cost of new equipment. An example of sheet-fed presses which are widely available at reasonable cost are Miller TP 38B presses made from the 1960's into the 1980's by the Miller Printing Machinery Co., of Pittsburgh, Pa.

While older presses similar to the Miller TP 38B series are still perfectly functional, they do have a number of drawbacks, chief among which is the fact that they are controlled by obsolete discrete component relay logic. The control relays are positioned on a series of printed circuit boards which are equipped with male edge connectors. The PC boards are removably connected to a press control circuit panel with mating female edge connectors. For example, a two color Miller TP 38B press has five removable relay circuit PC boards. Similarly, a four color TP 38B has six PC boards while a six color TP 38B has seven PC boards.

These relay logic PC boards, due to their age and the very nature of hard wired relay PC boards, are subject to high failure rates. When any one of the multiple PC boards fails, the press must be shut down until the board can be repaired or replaced. In addition, repair of replacement of individual PC boards is expensive. For example, typically, repair and rebuilding of each PC board can cost $400 or more while replacement with a new PC board is typically about double that or about $800. Thus, between costs associated with down time of the press and the costs of repairing or replacing the relay PC boards, economical use of older presses such as the Miller TP 38B is marginal at best.

It is clear, then, that a need exists to make existing printing presses such as the Miller TP 38B more reliable and more economical to run. At the same time, such a modification should be quickly accomplished to minimize press down time, and should be relatively inexpensive so as not to seriously erode the cost savings represented by the use of an older press. Finally, it would be preferable for such a conversion to be achievable by a press owner or operator themselves.

SUMMARY OF THE INVENTION

The present invention comprises a printing press programmable logic conversion apparatus and method for replacing a series of OEM relay logic printed circuit boards with a single programmable logic controller or PLC. The PLC is connected into a harness which includes a plurality of male edge connectors attached together and spaced apart the same as the OEM PC boards. The PLC is preprogrammed to accomplish the same tasks as the OEM PC boards such that, by removing the OEM PC boards and simply plugging in the PLC harness in their place, the press is converted to PLC control. The press is thus made much more reliable and economical to operate by and economical conversion which takes less than 10 minutes and can be accomplished by a press operator or owner.

OBJECTS AND ADVANTAGES OF THE INVENTION

The principle objects and advantages of the present invention include: providing a printing press programmable logic controller conversion apparatus and method; providing such an apparatus and method in which a plurality of OEM relay PC boards are replaced by a single PLC controller; providing such an apparatus and method in which the PLC controller is preprogrammed to accomplish all of the tasks of the OEM PC boards; providing such an apparatus and method in which the PLC controller is wired into a harness equipped with a plurality of edge connectors; providing such an apparatus and method in which the harness edge connectors are spaced the same as the OEM PC boards in the original printing press; providing such an apparatus and method in which the OEM PC boards can be removed and the PLC harness simply plugged in their place, thus allowing the printing press to be converted in a matter of minutes; and providing such an apparatus and method which is reliable, has a long operating life and which is particularly well adapted for the proposed usage thereof.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

BRIEF DESCRIPTION OF THE DRAWINGS

FIG. 3 is a perspective view of a PLC controller and harness in accordance with the present invention positioned for insertion in an OEM printing press PC board protective enclosure in place of the OEM PC boards which have been removed.

DETAILED DESCRIPTION OF THE PREFERRED EMBODIMENTS

I. Introduction and Environment

Figure 1:
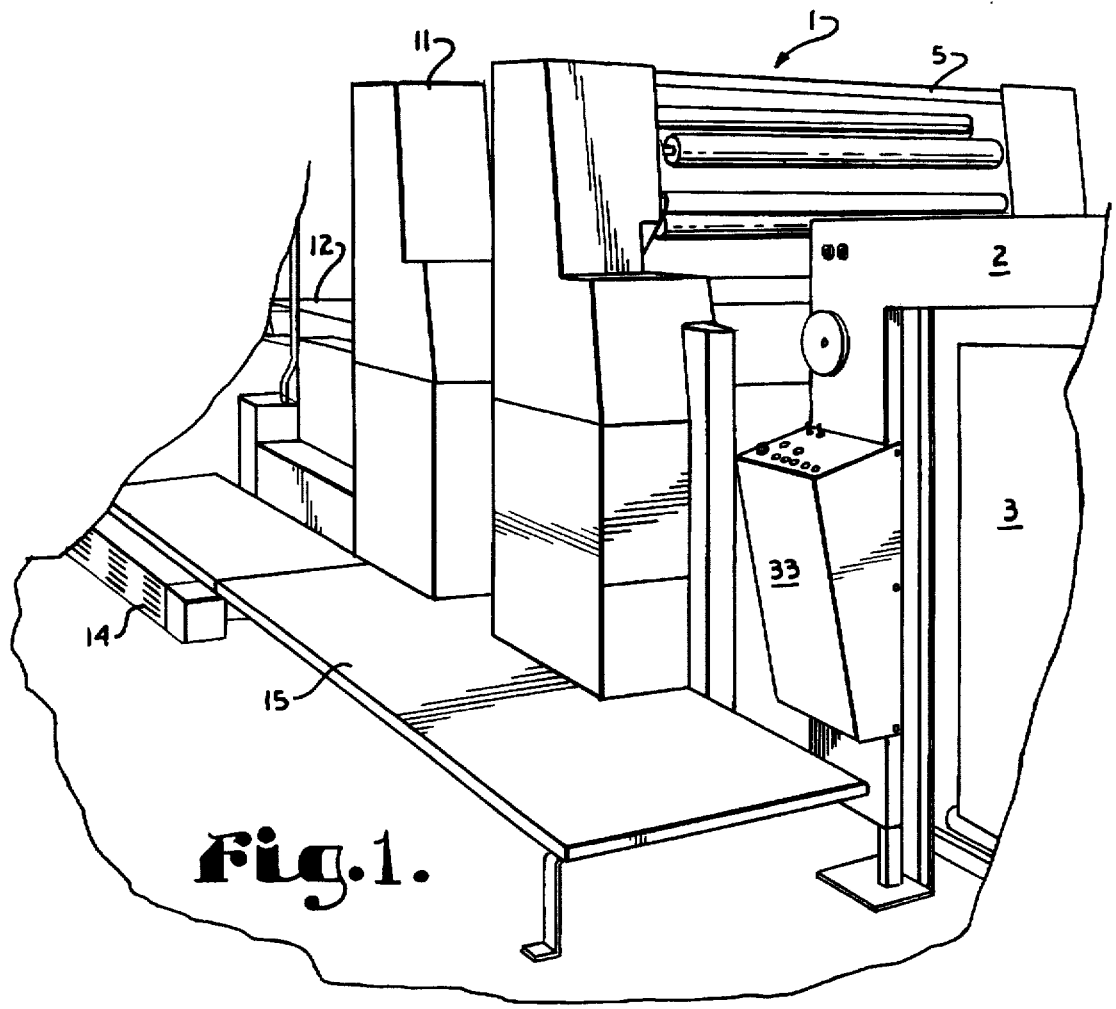
FIG. 1 is a perspective view of a two color sheet-fed printing press of the type which was originally controlled by a plurality of relay logic PC boards.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Certain terminology will be used in the following description for convenience in reference only and will not be limiting. For example, the words "up", "down", "right" and "left" will refer to directions in the drawings to which reference is made. Said terminology will include the words specifically mentioned, derivatives thereof and words of a similar import.

Referring to the drawings in more detail, reference numeral 1 in FIG. 1 generally designates a two color sheet-fed printing press similar to the Miller TP 38B mentioned above. The press 1, which is entirely conventional, includes a sheet feeder 2 which feeds paper sheets 3 to be printed from a pallet 4 into a first print unit 5 which impresses an image of a first color onto the paper sheets 3. From the first print unit 5, the paper sheets 3 are transferred to a second print unit 11 which impresses an image of a second color onto the sheets 3. The printed sheets 3 are then fed to a sheet stacker 12 which stacks them onto a receiving pallet (not shown) The press 1 can include a number of auxiliary attachments, such as a powder spray bar (not shown) positioned ahead of the stacker 12, a dryer (also not shown), etc.

Figure 2:
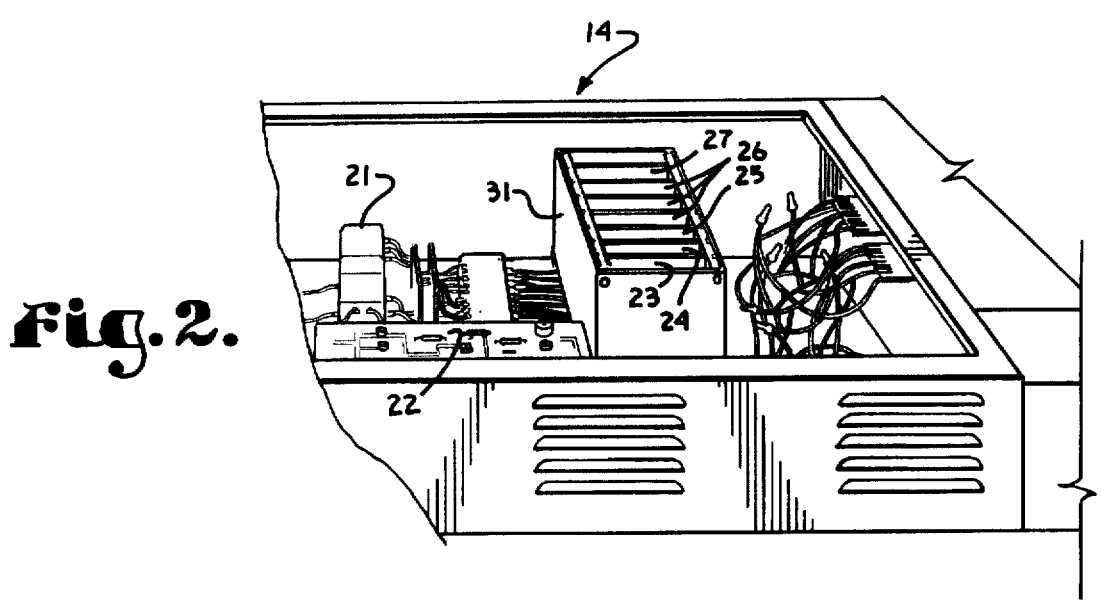
FIG. 2 is an enlarged, perspective view of prior art electrical power and control circuitry for the press of FIG. 1.

The press 1 and various auxiliary attachments, are electrically powered and controlled via circuitry located in a ventilated box 14 positioned beneath a catwalk 15. The box 14, which is shown open in FIG. 2, includes conventional transformers 21 and power supply circuitry 22 which supplies power to a plurality of OEM relay logic PC boards 23–27 which are removably installed in a protective enclosure 31. Each PC board 23–27 has a plurality of relays and associated relay control circuitry which perform press control functions as described below. Each of the PC boards 23–27 includes a male edge connector (not shown) which removably plugs into a respective one of a plurality of mating female edge connector receivers 32 (FIG. 3) positioned in the bottom of the PC board protective enclosure 31.

The following functions are specifically those performed by the various OEM PC boards in a Miller TP 38B printing press, but they are representative of relay logic PC boards in a number of comparable older sheet-fed presses.

The OEM PC board 23 includes: a relay circuit for timing a pre-run warning bell which sounds for a predetermined time prior to press start-up; and contains relay logic which is responsive to a run, crawl, inch forward or inch reverse button to prevent repetitive ringing of the pre-run warning bell, i.e. if press is not inched or otherwise moved by a press operator for five seconds (variable), the pre-run warning relay is reset.

The OEM PC board 24 includes: an inch relay which controls the inch function mentioned above; a run relay, which, when enabled by the engagement of a run button on the control panel 33, brings the press up to idle speed; a crawl relay which, when engaged, causes the press to run at an extremely slow, or "crawl" speed when the run button is pressed (the crawl or the run relay are alternatively energized); forward and reverse relays associated with the inch function; and relays responsive to safety guards on the press 1, which, if removed, allow only the crawl or inch relays to be engaged, but not the run relay.

The OEM PC board 25 includes: a number of relays which are also involved in the inch, crawl, idle and run modes as well as relays which allow the press to be switched to speed potentiometer control when a photo-eye detects a paper sheet 3 in position to be fed to the first printing unit 5; and a wash speed circuit which allows the photo-eye to be by-passed to allow the press to be run at a higher "wash speed" during cleaning.

The OEM PC board 26 controls the print units 5 and 11 by: controlling impression by bringing press cylinders and rollers (not shown) together via mechanical thrusters (also not shown); selects which print unit 5 and/or 11 to be brought on impression; and controls a shut-off for the sheet feeder 2. For a two color press, there is one PC board 26, for a four color press, there are two such PC boards 26, and for a six color press, there are three such PC boards 26, each of which controls a respective pair of print units.

Finally, the OEM PC board 27 contains various accessory control circuits, such as spray powder, dryers, air solenoids for the stacker 12 and the feeder 2, etc.

From the above brief functional description of the PC boards 23–27, it is clear that many press functions include relay logic circuitry which overlaps between two or more of the PC boards 23–27. Thus, failure of any circuit in any of the PC boards 23–27 can result in costly shut-down of the press 1 until such time as the faulty board can be repaired or replaced. As was previously mentioned, the failure rate among the OEM PC boards 23–27 is fairly high.

Referring to FIG. 3, a PLC controller 41 is attached to a top surface 42 of a rail 43 in a customized rack 44. The rack 44 also includes a plurality of rail sections 45 attached to a bottom side 46 of the rail 43 and extending transverse to the rail 43. A like plurality of male edge connectors 51–57 are attached to respective ones of the rail sections 45. The male edge connectors 51–57 are sized, spaced and positioned for insertion in respective ones of the female edge connector receivers 32. The PLC controller 41 is preprogrammed to accomplish each of the control functions of the OEM PC boards 23–27, but to do so with digital logic, thus resulting in a more precise and reliable control of the press 1. The PLC controller 41 is wired via wires 61 to various terminals 62 on the edge connectors 51–57 in order to emulate the connections and the control functions of the OEM PC boards 23–27.

In addition to the PLC controller 41, a pair of external relay circuits 63 and 64 are attached to the top surface 42 of the rail 43. The relay circuit 64, which is shown with a detachable relay removed, is used for applications which are potentially susceptible to voltage spikes which could damage the PLC 41, such as for use in an auxiliary spray bar or the like. The relay circuit 63 is used to disconnect output power to the PLC 41 when an emergency stop button is depressed. This prevents the press 1 from being accidentally started by a malfunction in the PLC 41 during emergency stop conditions.

Thus, with the PLC 41 attached to the inventive rack 44 equipped with the male edge connectors 51–57 which match the female edge connector receivers 32 in the enclosure 31, the press 1 can be converted to digital logic control in a matter of a few minutes. The conversion method involves simply unplugging the PC boards 23–27 and plugging in their place the preprogrammed PLC 41 via the rack 44.

The PLC controller 41, as an example, can be a Keyence KV-40R and Keyence KV-8EYR manufactured by the Keyence Corp. of Japan. The external relay circuits 63 and 64 can be IDEC SY2s-05 receptacles and plug-in relays and the edge connectors 51–57 can be VECTOR 22 pin connectors attached to and reinforced by corresponding rail sections 45.

Attached hereto as Appendix A is a logical ladder diagram for programming a Keyence KV-40R and KV-8EYR programmable logic controller to control a Miller TP 38B sheet-fed press in place of the OEM PC boards.

Although the description and accompanying drawings are directed to conversion of Miller sheet-fed presses, it should be noted that other, similar presses controlled via relay logic PC boards can be converted in a similar fashion. Furthermore, PLC's other than the Keyence models mentioned above can be used as well. Therefore, it should be understood that while certain forms of the present invention have been illustrated and described herein, it is not to be limited to the specific forms or arrangement of parts described and shown.

What is claimed and desired to be secured by Letters Patent is as follows:

1. A method of converting a printing press which is equipped with a plurality of discrete OEM PC boards, each PC board including an multiple contact edge connector with the PC boards being connected to the printing press by removably plugging each such edge connector into a corresponding one of a plurality of edge connector receivers which are electrically connected to the printing press, said OEM PC boards collectively at least partially controlling said printing press,. said method including the steps of:

a. preprogramming a digital PLC controller to emulate the control functions of said PC boards;

b. positioning said PLC controller on a rack equipped with a plurality of multiple contact edge connectors corresponding in number and position to said edge connector receivers of said printing press;

c. electrically connecting respective input and output terminals of said PLC controller to respective ones of said contacts on said edge connector of said rack; and d. removing said OEM PC boards from said printing press and plugging in said rack in place thereof.

2. A method as in claim 1, wherein said edge connector receivers are positioned proximate each other within an enclosure, said method including the step of sizing said rack and said PLC controller to fit within said enclosure.

3. A method as in claim 1, and further comprising the step of attaching one or more external relay circuits to said rack and electrically connecting each said external relay circuit to certain ones of the contacts of said edge connectors attached to said rack.

* * * * *